United States Patent
Suzuki et al.

(10) Patent No.: US 6,842,198 B2
(45) Date of Patent: Jan. 11, 2005

(54) TV SIGNAL RECEIVING TUNER CAPABLE OF OUTPUTTING OSCILLATION SIGNAL HAVING WIDE FREQUENCY BAND BY MEANS OF SINGLE LOCAL OSCILLATOR

(75) Inventors: Takeo Suzuki, Fukushima-ken (JP); Shigeru Osada, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 475 days.

(21) Appl. No.: 09/972,162

(22) Filed: Oct. 5, 2001

(65) Prior Publication Data

US 2002/0041340 A1 Apr. 11, 2002

(30) Foreign Application Priority Data

Oct. 5, 2000 (JP) ......................................... 2000-311726

(51) Int. Cl.[7] ................................................ H04N 5/50
(52) U.S. Cl. ......................... 348/731; 348/725; 348/729
(58) Field of Search ................................ 348/731, 732, 348/733, 725, 729, 524, 536; 455/180.1, 180.2, 180.3, 182.1, 188.1, 188.2, 190.1, 318, 265; 334/18, 21, 89

(56) References Cited

U.S. PATENT DOCUMENTS

| | | | | |
|---|---|---|---|---|
| 4,510,623 A | * | 4/1985 | Bonneau et al. | ............... 725/27 |
| 4,982,444 A | * | 1/1991 | Matsuura | .................. 455/188.2 |
| 5,014,349 A | * | 5/1991 | Kubo et al. | ............... 455/189.1 |
| 5,029,237 A | * | 7/1991 | Ragan | ...................... 455/182.2 |
| 5,193,005 A | * | 3/1993 | Tomita | ........................ 348/731 |
| 5,752,179 A | * | 5/1998 | Dobrovolny | ................. 455/266 |
| 5,857,004 A | * | 1/1999 | Abe | ............................ 375/344 |
| 5,884,153 A | * | 3/1999 | Okada | ...................... 455/243.1 |
| 5,983,088 A | * | 11/1999 | Aschwanden | ............. 455/188.2 |
| 6,016,170 A | * | 1/2000 | Takayama et al. | ........... 348/731 |
| 6,108,050 A | * | 8/2000 | Yamamoto et al. | .......... 348/731 |
| 6,177,964 B1 | * | 1/2001 | Birleson et al. | ............. 348/725 |
| 6,243,567 B1 | * | 6/2001 | Saito | ........................ 455/188.2 |
| 6,246,866 B1 | * | 6/2001 | Phang et al. | .............. 455/188.2 |
| 6,396,550 B1 | * | 5/2002 | Oh | ............................... 348/735 |
| 6,438,361 B1 | * | 8/2002 | Chong et al. | ............. 455/188.1 |
| 6,573,949 B1 | * | 6/2003 | Yamamoto | ................... 348/731 |

FOREIGN PATENT DOCUMENTS

JP          2000-013705          1/2000

\* cited by examiner

Primary Examiner—Michael H. Lee
Assistant Examiner—Jean W. Désir
(74) Attorney, Agent, or Firm—Brinks Hofer Gilson & Lione

(57) ABSTRACT

A TV signal receiving tuner which is small in size and inexpensive due to a reduced number of local oscillators. In the TV signal receiving tuner, a local oscillation signal output from a local oscillator is directly applied to a first mixer through a first programmable divider to receive a UHF TV signal, the local oscillation signal output from the local oscillator is applied to the first mixer after its frequency is divided to 1/3 by the first programmable divider to receive a VHF high-band TV signal, and the local oscillation signal output from the local oscillator is applied to the first mixer after its frequency is divided to 1/5 by the first programmable divider to receive a VHF low-band TV signal.

20 Claims, 3 Drawing Sheets

TV SIGNAL RECEIVING TUNER CAPABLE OF OUTPUTTING OSCILLATION SIGNAL HAVING WIDE FREQUENCY BAND BY MEANS OF SINGLE LOCAL OSCILLATOR

BACKGROUND OF THE INVENTION

1. Field of the Invention

The present invention relates to a TV signal receiving tuner and, more specifically, to a TV signal receiving tuner which can be reduced in size and cost.

2. Description of the Related Art

TV signals are divided into UHF (806 to 470 MHz in the U.S.), VHF high-band (216 to 174 MHz in the U.S.) and VHF low-band (88 to 54 MHz in the U.S.) signals when they are received.

As shown in FIG. 3, a tuner comprises an input terminal 32 connected to an antenna 31, a UHF mono-tuning circuit 33, a UHF high-frequency amplifier 34, a UHF multi-tuning circuit 35, a UHF mixer 36, a UHF local oscillator 37, a UHF resonance circuit 38, a VHF high-band mono-tuning circuit 39, a VHF high-band high-frequency amplifier 40, a VHF high-band multi-tuning circuit 41, a VHF high-band mixer 42, a VHF high-band local oscillator 43, a VHF high-band resonance circuit 44, a VHF low-band mono-tuning circuit 45, a VHF low-band high-frequency amplifier 46, a VHF low-band multi-tuning circuit 47, a VHF low-band mixer 48, a VHF low-band local oscillator 49, a VHF low-band resonance circuit 50, a filter 51, an intermediate-frequency amplifier 52, a PLL IC 53, a quartz oscillator 54, a local oscillator switch 55 and a tuner output terminal 56.

To receive a UHF TV signal, a TV signal received by the antenna 31 is tuned by the UHF mono-tuning circuit 33, amplified by the UHF high-frequency amplifier 34, and tuned by the UHF multi-tuning circuit 35. The tuning frequencies of the UHF mono-tuning circuit 33 and the UHF multi-tuning circuit 35 are changed by a tuning voltage Vt output from the PLL IC 53 and tuned at the frequency band of a channel to be received. Since the output impedance of the antenna 31 is low and the input impedances of the UHF high-frequency amplifier 34 and the UHF multi-tuning circuit 35 are high, impedance matching is carried out by the UHF mono-tuning circuit 33.

The TV signal output from the UHF multi-tuning circuit 35 is applied to the UHF mixer 36. One input terminal of the UHF mixer 36 is connected to the output terminal of the UHF multi-tuning circuit 35 and the other input terminal is connected to the UHF local oscillator 37. The UHF local oscillator 37 is connected to the UHF resonance circuit 38 so that a local oscillation signal output from the UHF local oscillator 37 is changed by the tuning voltage Vt input from the PLL IC 53 into the UHF resonance circuit 38. Since the UHF local oscillator 37 outputs a local oscillation signal which is 44 MHz higher than a TV signal to be received, a converted signal having an intermediate frequency of 44 MHz is output from the output terminal of the UHF mixer 36.

The intermediate-frequency signal is applied to the filter 51. The filter 51 is a band-pass filter having sharp characteristics and connected to the intermediate-frequency amplifier 52. The intermediate-frequency signal amplified by the intermediate-frequency amplifier 52 is output from the output terminal 56 of the tuner.

When a VHF high-band TV signal is received, the TV signal received by the antenna 31 is applied to the filter 51 through the VHF high-band mono-tuning circuit 39, VHF high-band high-frequency amplifier 40, VHF high-band multi-tuning circuit 41 and VHF high-band mixer 42. As the operations of the above circuits are the same as the UHF circuits, their descriptions are omitted. As the operation of the VHF high-band local oscillator 43 and the operation of the VHF high-band resonance circuit 44 are also the same as the UHF circuits, their descriptions are omitted.

When a VHF low-band TV signal is received, the TV signal received by the antenna 31 is applied to the filter 51 through the VHF low-band mono-tuning circuit 45, VHF low-band high-frequency amplifier 46, VHF low-band multi-tuning circuit 47 and VHF low-band mixer 48. As the operations of the above circuits are the same as the UHF circuits, their descriptions are omitted. As the operation of the VHF low-band local oscillator 49 and the operation of the VHF low-band resonance circuit 50 are also the same as the UHF circuits, their descriptions are omitted.

The PLL IC 53 is a circuit for selecting a channel to be received. To receive a UHF band channel, a UHF band switch voltage Vu for selecting a UHF band channel is applied to the UHF high-frequency amplifier 34 and a tuning voltage Vt corresponding to the selected channel is applied to the UHF mono-tuning circuit 33, the UHF multi-tuning circuit 35 and the UHF resonance circuit 38. To receive a VHF high-band channel, a VHF high-band switch voltage Vhi for selecting a VHF high-band channel is applied to the VHF high-band high-frequency amplifier 40 and a tuning voltage Vt corresponding to the selected channel is applied to the VHF high-band mono-tuning circuit 39, the VHF high-band multi-tuning circuit 41 and the VHF high-band resonance circuit 44. To receive a VHF low-band channel, a VHF low-band switch voltage Vhi for selecting a VHF low-band channel is applied to the VHF low-band high-frequency amplifier 46 and a tuning voltage Vt corresponding to the selected channel is applied to the VHF low-band mono-tuning circuit 45, the VHF low-band multi-tuning circuit 47 and the VHF low-band resonance circuit 50. Further, a control voltage is applied to a local oscillator switch 55 in the PLL IC 53.

SUMMARY OF THE INVENTION

To improve the accuracy of the frequency of the local oscillation signal output from the local oscillator, the ratio of the highest oscillation frequency to the lowest oscillation frequency of the local oscillation signal must be controlled to 3:1 or less, preferably 2:1 or less. Therefore, the above-mentioned tuner requires three local oscillators and resonance circuits for UHF, VHF high-band and VHF low-band channels, whereby the tuner becomes bulky and costs dear. The present invention has been made in view of the above situation and an object of the present invention is to provide a small-sized and inexpensive tuner.

To solve the above problem, according to a first aspect of the present invention, there is provided a TV signal receiving tuner for receiving TV signals by dividing them into a plurality of frequency bands, comprising a local oscillator which oscillates at a frequency range corresponding to a TV signal having a predetermined frequency band, a first programmable divider which receives a local oscillation signal of the local oscillator and divides the local oscillation signal, and a first mixer which mixes the received TV signal and the output of the first programmable divider and frequency converts the received TV signal into an intermediate-frequency signal having a predetermined frequency, wherein the dividing rate of the first programmable divider is variable and set to 1 to receive the TV signal having a predetermined frequency band and to 1/2 or less to receive a TV signal having a frequency band lower than the predetermined frequency band.

According to a second aspect of the present invention, there is provided a TV signal receiving tuner for receiving TV signals by dividing them into a plurality of frequency bands, comprising a local oscillator which oscillates at a frequency range corresponding to a TV signal having a predetermined frequency band, a second programmable divider which receives a local oscillation signal of the local oscillator and divides the local oscillation signal, a second mixer which mixes the received TV signal and the local oscillation signal and frequency converts the received TV signal into an intermediate-frequency signal having a predetermined frequency, and a third mixer which mixes the received TV signal and the output of the second programmable divider and frequency converts the received TV signal into an intermediate-frequency signal having a predetermined frequency, wherein frequency conversion is carried out by the second mixer to receive the TV signal having a predetermined frequency band, and wherein frequency conversion is carried out by the third mixer to receive the TV signal having a frequency band lower than the above predetermined frequency band.

According to a third aspect of the present invention, there is provided a TV tuner wherein a dividing rate of the second programmable divider is variable and changed according to an area where it is used.

According to a fourth aspect of the present invention, there is provided a TV tuner wherein a first tracking filter for selecting the TV signal having a predetermined frequency band and a second tracking filter for selecting the TV signal having a frequency band lower than the predetermined frequency band are arranged in parallel to each other, wherein a PLL IC for outputting a tuning voltage for changing the frequency of the local oscillation signal output from the local oscillator is provided, and wherein the tuning voltage is applied to the first tracking filter and the second tracking filter to tune a pass band of the first tracking filter or the second tracking filter to a frequency of the TV signal to be received.

According to a fifth aspect of the present invention, there is provided a TV tuner wherein the first tracking filter and the second tracking filter are a multi-tuning circuit.

According to a sixth aspect of the present invention, there is provided a TV tuner wherein a low-noise first preamplifier having an AGC function is provided after the first tracking filter, and wherein a low-noise second preamplifier having an AGC function is provided after the second tracking filter.

According to a seventh aspect of the present invention, there is provided a TV tuner wherein a first image trap circuit for attenuating an image frequency signal corresponding to a TV signal to be received is interposed between the first preamplifier and the second mixer, and wherein a second image trap circuit for attenuating an image frequency signal corresponding to a TV signal to be received is interposed between the second preamplifier and the third mixer.

According to an eighth aspect of the present invention, there is provided a TV tuner wherein the local oscillator outputs an oscillation signal having a frequency band of at least 847 to 505 MHz, and wherein the dividing rate of the first programmable divider can be changed to at least 1, 1/3 and 1/5.

According to a ninth aspect of the present invention, there is provided a TV tuner wherein the local oscillator outputs an oscillation signal having a frequency band of at least 803 to 473 MHz, and wherein the dividing rate of the first programmable divider can be changed to at least 1, 1/3 and 1/9.

According to a tenth aspect of the present invention, there is provided a TV tuner wherein the local oscillator outputs an oscillation signal having a frequency band of at least 824 to 530 MHz, and wherein the dividing rate of the first programmable divider can be changed to at least 1, 1/3 and 1/4.

According to an eleventh aspect of the present invention, there is provided a TV tuner wherein the local oscillator outputs an oscillation signal having a frequency band of at least 767 to 473 MHz, and wherein the dividing rate of the first programmable divider can be changed to at least 1, 1/3 and 1/6.

According to a twelfth aspect of the present invention, there is provided a TV tuner comprising a third programmable divider for receiving the oscillation signal of the local oscillator and dividing the oscillation signal and a fourth mixer for mixing the received TV signal and the output of the third programmable divider and frequency converting the received TV signal into an intermediate-frequency signal having a predetermined frequency, wherein the local oscillator outputs an oscillation signal having a frequency band of at least 847 to 505 MHz, wherein the dividing rate of the second programmable divider is 1/3, and wherein the dividing rate of the third programmable divider is 1/5.

According to a thirteenth aspect of the present invention, there is provided a TV tuner comprising a third programmable divider for receiving the oscillation signal of the local oscillator and dividing the oscillation signal and a fourth mixer for mixing the received TV signal and the output of the third programmable divider and frequency converting the received TV signal into an intermediate-frequency signal having a predetermined frequency, wherein the local oscillator outputs an oscillation signal having a frequency band of at least 803 to 473 MHz, wherein the dividing rate of the second programmable divider is 1/3, and wherein the dividing rate of the third programmable divider is 1/9.

According to a fourteenth aspect of the present invention, there is provided a TV tuner comprising a third programmable divider for receiving the oscillation signal of the local oscillator and dividing the oscillation signal and a fourth mixer for mixing the received TV signal and the output of the third programmable divider and frequency converting the received TV signal into an intermediate-frequency signal having a predetermined frequency, wherein the local oscillator outputs an oscillation signal having a frequency band of at least 824 to 530 MHz, wherein the dividing rate of the second programmable divider is 1/3, and wherein the dividing rate of the third programmable divider is 1/4.

According to a fifteenth aspect of the present invention, there is provided a TV tuner comprising a third programmable divider for receiving the oscillation signal of the local oscillator and dividing the oscillation signal and a fourth mixer for mixing the received TV signal and the output of the third programmable divider and frequency converting the received TV signal into an intermediate-frequency signal having a predetermined frequency, wherein the local oscillator outputs an oscillation signal having a frequency band of at least 767 to 473 MHz, wherein the dividing rate of the second programmable divider is 1/3, and wherein the dividing rate of the third programmable divider is 1/6.

The other objects and advantages of the present invention will become obvious from the following description.

DETAILED DESCRIPTION OF THE PREFERRED EMBODIMENTS

The tuner of the present invention will be described hereinbelow with reference to FIG. 1 and FIG. 2. The tuner receives TV signals by dividing them into UHF (806 to 470 MHz in the U.S.), VHF high-band (216 to 174 MHz in the U.S.) and VHF low-band (88 to 54 MHz in the U.S.) signals.

Figure 1:
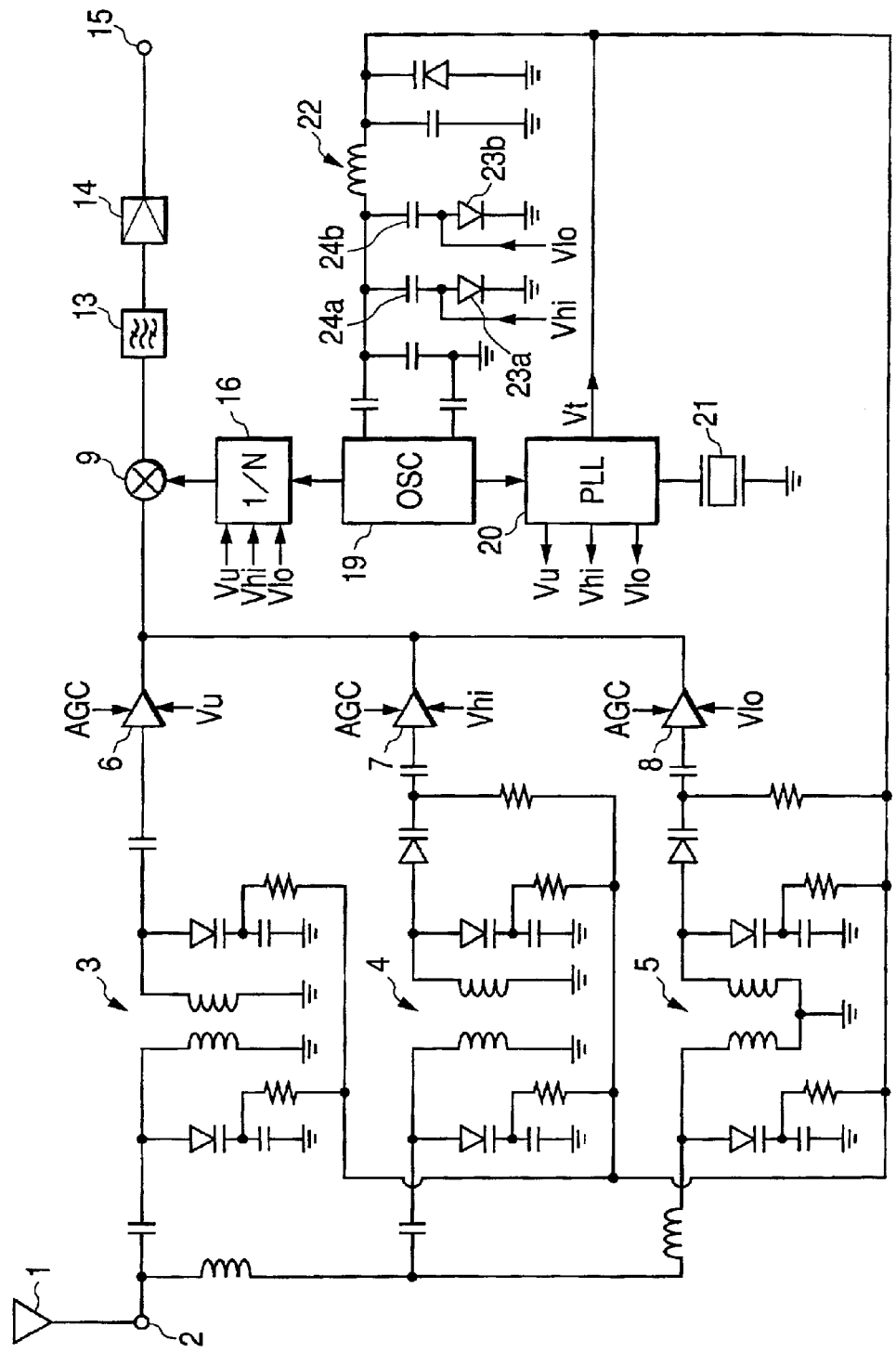
FIG. 1 is a circuit diagram of a TV signal receiving tuner according to the present invention.

The tuner shown in FIG. 1 comprises an input terminal 2 connected to an antenna 1, a first tracking filter 3, a first high-frequency amplifier 6, a second tracking filter 4, a second high-frequency amplifier 7, a third tracking filter 5, a third high-frequency amplifier 8, a first mixer 9, a filter 13, an intermediate-frequency amplifier 14, an output terminal 15 of the tuner, a first programmable divider 16, a local oscillator 19, a PLL IC 20, a quartz oscillator 21 and a resonance circuit 22.

To receive a UHF TV signal, a band selection signal Vu for receiving UHF is output from the PLL IC 20, a band selection signal Vhi for receiving VHF high-band and a band selection signal Vlo for receiving VHF low-band are not output, the first preamplifier 6 is activated and the second preamplifier 7 and the third preamplifier 9 are not activated. In this state, a TV signal received by the antenna 1 is tuned by the first tracking filter 3 and amplified by the first preamplifier 6. The first tracking filter 3 is a multi-tuning circuit and its tuning frequency is changed by a tuning voltage Vt output from the PLL IC 20 and tuned to the frequency band of a channel to be received. Since the first preamplifier 6 is a low-noise amplifier having an AGC function, even when a signal applied to the first preamplifier 6 is at a low level, NF does not deteriorate. Therefore, even when the first tracking filter 3 having high input impedance is connected after the antenna 1 having low output impedance, the NF of the output of the first preamplifier 6 does not deteriorate.

To receive a VHF high-band TV signal, a band selection signal Vhi for receiving VHF high-band is output from the PLL IC 20, a band selection signal Vu for receiving UHF and a band selection signal Vlo for receiving VHF low-band are not output, the second preamplifier 7 is activated, and the first preamplifier 6 and the third preamplifier 8 are not activated. In this state, a TV signal received by the antenna 1 is tuned by the second tracking filter 4 and amplified by the second preamplifier 7. The second tracking filter 4 is a multi-tuning circuit and its tuning frequency is changed by a tuning voltage Vt output from the PLL IC 20 and tuned to the frequency band of a channel to be received. Since the second preamplifier 7 is a low-noise amplifier having an AGC function, even when the signal input into the second preamplifier 7 is at a low level, NF does not deteriorate. Therefore, even when the second tracking filter 4 having high input impedance is connected after the antenna 1 having low output impedance, NF of the output of the second preamplifier 7 does not deteriorate.

To receive a VHF low-band TV signal, a band selection signal Vlo for receiving VHF low-band is output from the PLL IC 20, a band selection signal Vu for receiving UHF and a band selection signal Vhi for receiving VHF high-band are not output, the third amplifier 8 is activated, and the first preamplifier 6 and the second preamplifier 7 are not activated. In this state, a TV signal received by the antenna 1 is tuned by the third tracking filter 5 and amplified by the third preamplifier 8. The third tracking filter 5 is a multi-tuning circuit and its tuning frequency is changed by a tuning voltage Vt output from the PLL IC 20 and tuned to the frequency band of a channel to be received. Since the third preamplifier 8 is a low-noise amplifier having an AGC function, even when the signal input into the third preamplifier 8 is at a low level, NF does not deteriorate, Therefore, even when the third tracking filter 5 having high input impedance is connected after the antenna 1 having low output impedance, NF of the output of the third preamplifier 8 does not deteriorate.

The TV signal output from the first preamplifier 6, the second preamplifier 7 or the third preamplifier 8 is applied to the first mixer 9. The first mixer 9 mixes the TV signal and a local oscillation signal having a frequency 44 MHz higher than the TV signal and outputs a 44 MHz intermediate-frequency signal.

The intermediate-frequency signal is applied to the filter 13. The filter 13 is a band-pass filter having sharp characteristics and connected to the intermediate-frequency amplifier 14. The intermediate-frequency signal amplified by the intermediate-frequency amplifier 14 is output from the output terminal 15 of the tuner.

The local oscillation signal output from the local oscillator 19 is applied to the first mixer 9 after it is divided by the first programmable divider 16. The frequency of the local oscillation signal is controlled by a tuning voltage Vt, a band selection signal Vhi for receiving VHF high-band and a band selection signal Vlo for receiving VHF low-band which are applied to the resonance circuit 22. To receive a UHF channel, a band selection signal Vhi for receiving VHF high-band and a band selection signal Vlo for receiving VHF low-band are not applied to the resonance circuit 22, switch diodes 23a and 23b are off, and the local oscillator 19 outputs a local oscillation signal having a frequency of 847 to 517 MHz. To receive a VHF high-band channel, a band selection signal Vhi for receiving VHF high-band is applied to the resonance circuit 22, the switch diode 23a is turned on to activate a capacitor 24a, a band selection signal Vlo for receiving VHF low-band is not applied to turn off the switch diode 23b, and the local oscillator 19 outputs a local oscillation signal having a frequency of 771 to 663 MHz. To receive a VHF low-band channel, a band selection signal Vlo for receiving VHF low-band is applied to the resonance circuit 22, the switch diode 23b is turned on to activate a capacitor 24b, a band selection signal Vhi for receiving VHF high-band is not applied to turn off the switch diode 23a, and the local oscillator 19 outputs a local oscillation signal having a frequency of 645 to 505 MHz.

The local oscillation signal output from the local oscillator 19 is output to the first programmable divider 16 and the PLL IC 20. The PLL IC 20 compares the local oscillation signal output from the local oscillator 19 with a reference oscillation signal output from the quartz oscillator 21 and controls a tuning voltage Vt to adjust the frequency of the reference oscillation signal to a predetermined frequency. One of the band selection signals Vu, Vhi and Vlo is applied to the first programmable divider 16 from the PLL IC 20. To receive a UHF channel TV signal, the band selection signal Vu for receiving UHF is applied to the first programmable divider 16, the dividing rate of the first programmable divider 16 is set to 1, and the local oscillation signal applied to the first programmable divider 16 is directly output to the first mixer 9. To receive a VHF high-band channel TV signal, the band selection signal Vhi for receiving VHF high-band is applied to the first programmable divider 16, the dividing rate of the first programmable divider 16 is set to 1/3, and the local oscillation signal applied to the first programmable divider 16 is divided to generate a signal having a frequency 1/3 that of the local oscillation signal which is then output to the first mixer 9. To receive a VHF low-band channel TV signal, the band selection signal Vlo for receiving VHF low-band is applied to the first programmable divider 16, the dividing rate of the first programmable divider 16 is set to 1/5, and the local oscillation signal applied to the first programmable divider 16 is divided to generate a signal having a frequency 1/5 that of the local oscillation signal which is then output to the first mixer 10.

In the above embodiment, the intermediate frequency is 44 MHz. When the intermediate frequency is 0 Hz, to receive a UHF channel, the local oscillator 19 is oscillated at 803 to 473 MHz, and the dividing rate of the first programmable divider 16 is set to 1. To receive a VHF high-band channel, the local oscillator 19 is oscillated at 639 to 531 MHz and the dividing rate of the first programmable divider 16 is set to 1/3. To receive a VHF low-band channel, the local oscillator 19 is oscillated at 765 to 513 MHz and the dividing rate of the first programmable divider 16 is set to 1/9.

When the TV tuner of the present invention is used in products to be marketed in Japan, as the UHF band is 770 to 470 MHz, the VHF high-band is 222 to 170 MHz and the VHF low-band is 108 to 90 MHz and the intermediate frequency is generally 57 MHz. Therefore, to receive a UHF channel, the local oscillator 19 is oscillated at 824 to 530 MHz and the dividing rate of the first programmable divider 16 is set to 1. To receive a VHF high-band channel, the local oscillator 19 is oscillated at 810 to 690 MHz and the dividing rate of the first programmable divider 16 is set to 1/3, To receive a VHF low-band channel, the local oscillator 19 is oscillated at 648 to 600 MHz and the dividing rate of the first programmable divider 16 is set to 1/4.

Further, when the intermediate frequency is set to 0 Hz in products to be marketed in Japan, to receive a UHF channel, the local oscillator 19 is oscillated at 767 to 473 MHz and the dividing rate of the first programmable divider is set to 1. To receive a VHF high-band channel, the local oscillator 19 is oscillated at 657 to 519 MHz and the dividing rate of the first programmable divider 16 is set to 1/3. To receive a VHF low-band channel, the local oscillator 19 is oscillated at 630 to 558 MHz and the dividing rate of the first programmable divider 16 is set to 1/6.

Figure 2:
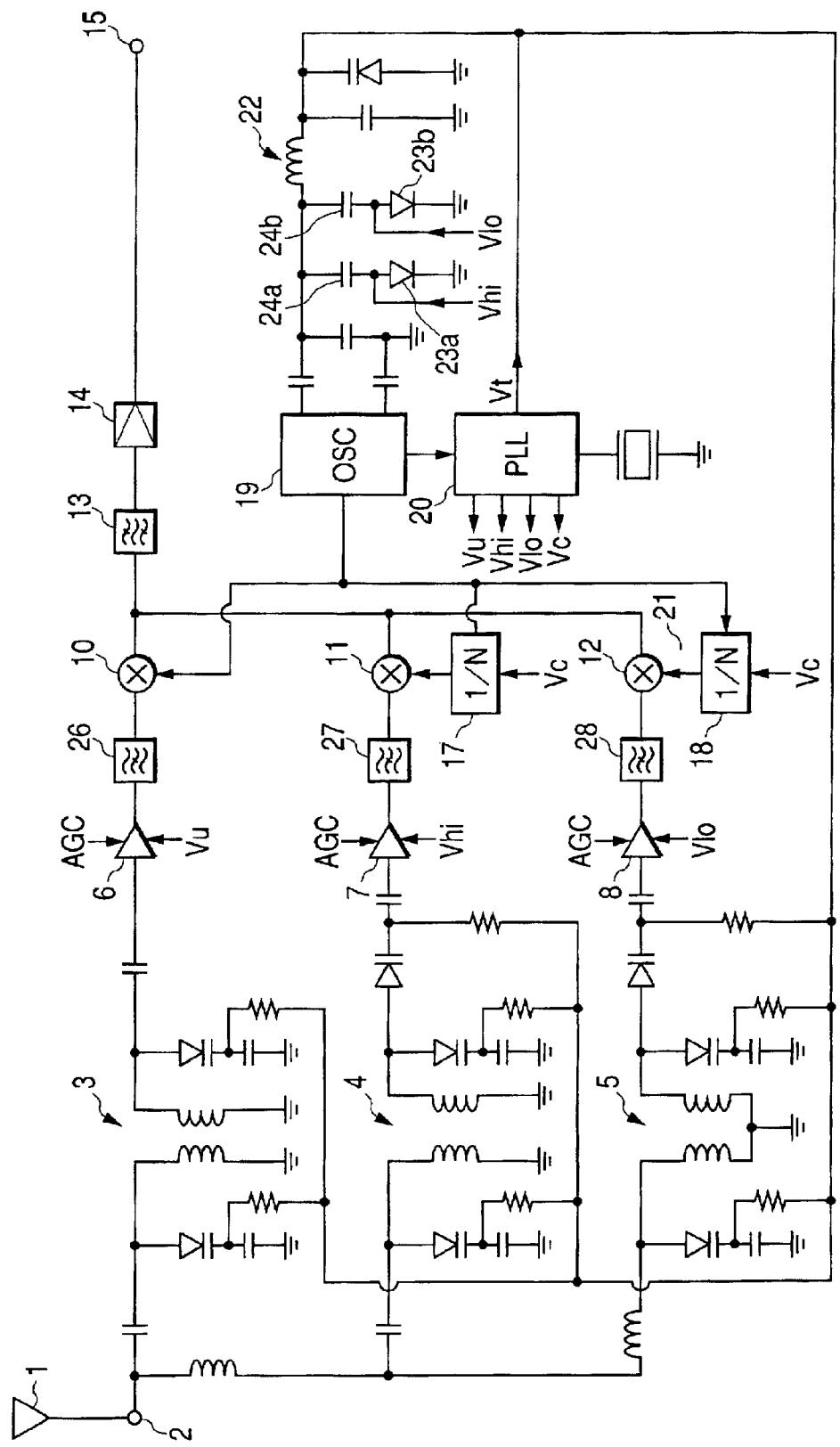
FIG. 2 is a circuit diagram showing another embodiment of a TV signal receiving tuner according to the present invention.
Figure 3:
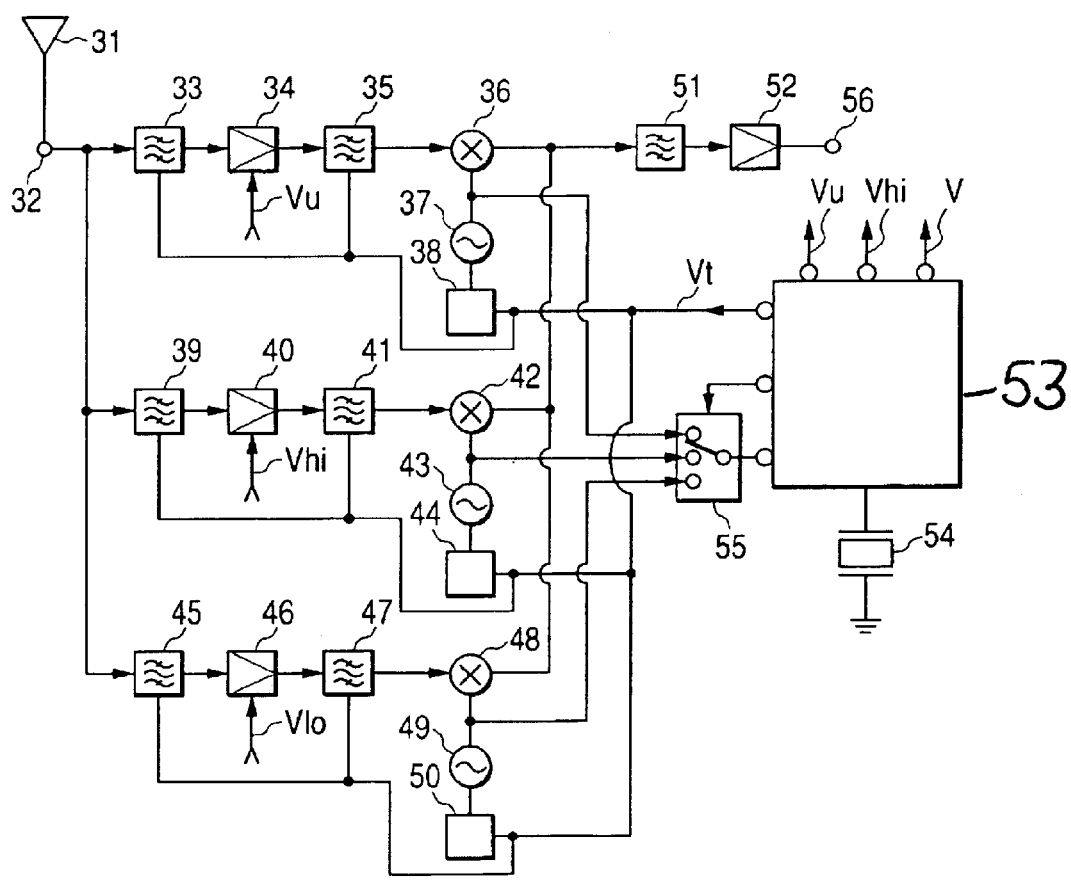
FIG. 3 is a circuit diagram of a prior art TV signal receiving tuner.

FIG. 2 shows another embodiment of the tuner of the present invention. This tuner uses a plurality of mixers for different frequency bands to carry out frequency conversion. The same elements as in FIG. 1 are given the same reference numerals and their descriptions are omitted.

A nation identification signal Vc is output from the, PLL IC 20 to a second programmable divider 17 and a third programmable divider 18. In the case of products to be marketed in the U.S., when the tuner is powered on, the dividing rate of the second programmable divider 17 is set to 1/3 and the dividing rate of the third programmable divider 18 is set to 1/5.

To receive a UHF channel TV signal, the TV signal output from the first preamplifier 6 is applied to a second mixer 10 after an image frequency signal is attenuated by a first image trap 26. The local oscillation signal is directly applied to the second mixer 10 from the local oscillator 19 so that the frequency of the TV signal is converted into an intermediate frequency of 44 MHz by the local oscillation signal.

To receive a VHF high-band channel TV signal, the TV signal output from the second preamplifier 7 is applied to a third mixer 11 after an image frequency signal is attenuated by a second image trap 27. The local oscillation signal output from the local oscillator 19 is applied to the third mixer 11 after its frequency is divided to 1/3 by the second programmable divider 17 so that the frequency of the TV signal is converted into an intermediate frequency of 44 MHz by the local oscillation signal.

To receive a VHF low-band channel TV signal, the TV signal output from the third preamplifier 8 is applied to a fourth mixer 12 after an image frequency signal is attenuated by a third image trap 28. The local oscillation signal output from the local oscillator 19 is applied to the fourth mixer 12 after its frequency is divided to 1/5 by the third programmable divider 18 so that the frequency of the TV signal is converted into an intermediate frequency of 44 MHz by the local oscillation signal.

To use this tuner in products to be marketed in Japan, a nation identification signal Vc output from the PLL IC 20 is converted into a code indicative of Japan and output to the second programmable divider 17 and the third programmable divider 18, and the dividing rate of the second programmable divider 17 is set to 1/3 and the dividing rate of the third programmable divider 18 is set to 1/5 when the tuner is powered on.

To receive a UHF channel, a local oscillation signal having a frequency of 824 to 530 MHz is output from the local oscillator 19. To receive a VHF high-band channel, the local oscillator 19 is oscillated at 810 to 690 MHz and the dividing rate of the second programmable divider 17 is set to 1/3. To receive a VHF low-band channel, the local oscillator 19 is oscillated at 648 to 600 MHz and the dividing rate of the third programmable divider 18 is set to 1/4.

In the above embodiment, the intermediate frequency is 44 MHz. When the intermediate frequency is 0 Hz, the dividing rate of the second programmable divider 17 is set to 1/3 and the dividing rate of the third programmable divider 18 is set to 1/9. To receive a UHF channel, the local oscillator 19 is oscillated at 803 to 473 MHz. To receive a VHF high-band channel, the local oscillator 19 is oscillated at 639 to 531 MHz. To receive a VHF low-band channel, the local oscillator 19 is oscillated at 765 to 513 MHz.

When this tuner is used in TVs to be marketed in Japan, the dividing rate of the second programmable divider 17 is set to 1/3 and the dividing rate of the third programmable divider 18 is set to 1/6. To receive a UHF channel, the local oscillator 19 is oscillated at 767 to 473 MHz. To receive a VHF high-band channel, the local oscillator 19 is oscillated at 657 to 519 MHz and to receive a VHF low-band channel, the local oscillator 19 is oscillated at 630 to 558 MHz.

As described above, the TV receiving tuner of the present invention can output an oscillation signal having a wide frequency band by means of one local oscillator and can be made small in size and inexpensive by using one or a plurality of dividers.

Since the dividing rate of the programmable divider is variable and is changed according to the area where it is used in the TV receiving tuner of the present invention, the same tuner can be used in different areas which differ in TV receiving frequency.

Since a tuning voltage for changing the frequency of the local oscillation signal of the local oscillator is applied to the tracking filter to tune the pass band of the tracking filter to the frequency of the TV signal in the TV receiving tuner of the present invention, the pass band of the tracking filter changes according to the frequency of the local oscillation signal of the local oscillator.

Since the tracking filter is a multi-tuning circuit in the TV receiving tuner of the present invention, characteristics on the inlet side and characteristics on the outlet side can be designed separately, thereby making it easy to adjust input and output characteristics to circuits before and after the input and outlet sides. Since the attenuation of a signal having an unrequired frequency is large, cross modulation hardly occurs in the mixer.

Since a low-noise preamplifier having an AGC function is interposed between the tracking filter and the mixer in the TV receiving tuner of the present invention, a mono-tuning circuit is not necessary, thereby making it possible to reduce the size of the tuner.

Since a trap circuit for attenuating an image frequency is provided in the TV receiving tuner of the present invention, the noise of the received signal is reduced.

Since the local oscillator can be oscillated at 847 to 505 MHz and the dividing rate of the first programmable divider can be changed to 1, 1/3 or 1/5 in the TV receiving tuner of the present invention, the TV signal of the U.S. can be converted into an intermediate-frequency signal having a frequency of 44 MHz.

Since the local oscillator can be oscillated at 803 to 473 MHz and the dividing rate of the first programmable divider can be changed to 1, 1/3 or 1/9 in the TV receiving tuner of the present invention, the TV signal of the U.S. can be converted into an intermediate-frequency signal having a frequency of 0 Hz.

Since the local oscillator can be oscillated at 824 to 530 MHz and the dividing rate of the first programmable divider can be changed to 1, 1/3 or 1/4 in the TV receiving tuner of the present invention, the TV signal of Japan can be converted into an intermediate-frequency signal having a frequency of 57 MHz.

Since the local oscillator can be oscillated at 767 to 473 MHz and the dividing rate of the first programmable divider can be changed to 1, 1/3 or 1/6 in the TV receiving tuner of the present invention, the TV signal of Japan can be converted into an intermediate-frequency signal having a frequency of 0 Hz.

Since the local oscillator is oscillated at 847 to 505 MHz, the dividing rate of the second programmable divider is set to 1/3 and the dividing rate of the third programmable divider is set to 1/5 in the TV receiving tuner of the present invention, the TV signal of the U.S. can be converted into an intermediate-frequency signal having a frequency of 44 MHz.

Since the local oscillator is oscillated at 803 to 473 MHz, the dividing rate of the second programmable divider is set to 1/3 and the dividing rate of the third programmable divider is set to 1/9 in the TV receiving tuner of the present invention, the TV signal of the U.S. can be converted into an intermediate-frequency signal having a frequency of 0 Hz.

Since the local oscillator is oscillated at 824 to 530 MHz, the dividing rate of the second programmable divider is set to 1/3 and the dividing rate of the third programmable divider is set to 1/4 in the TV receiving tuner of the present invention, the TV signal of Japan can be converted into an intermediate-frequency signal having a frequency of 57 MHz.

Since the local oscillator is oscillated at 767 to 473 MHz, the dividing rate of the second programmable divider is set to 1/3 and the dividing rate of the third programmable divider is set to 1/6 in the TV receiving tuner of the present invention, the TV signal of Japan can be converted into an intermediate-frequency signal having a frequency of 0 Hz.

What is claimed is:

1. A TV signal receiving tuner for receiving TV signals by dividing them into a plurality of frequency bands, comprising:

a local oscillator which oscillates at a frequency range corresponding to a received TV signal having a predetermined frequency band;

a second programmable divider which receives a local oscillation signal of the local oscillator and divides the local oscillation signal;

a second mixer which directly receives the local oscillation signal and which mixes the received TV signal and the local oscillation signal and frequency converts the received TV signal into an intermediate-frequency signal having a first frequency; and a third mixer which receives an output of the second programmable divider and which mixes the received TV signal and an output of the second programmable divider and frequency converts the received TV signal into an intermediate-frequency signal having a second frequency, wherein frequency conversion is carried out by the second mixer to receive a TV signal having a first frequency band, and wherein frequency conversion is carried out by the third mixer to receive a TV signal having a frequency band lower than the first frequency band.

2. The TV receiving tuner according to claim 1, wherein a dividing rate of the second programmable divider is variable and dependent upon a geographical location in which the TV receiving tuner is disposed.

3. The TV receiving tuner according to claim 1, further comprising:

a third programmable divider to receive the oscillation signal of the local oscillator and divide the oscillation signal; and a fourth mixer to mix the received TV signal and an output of the third programmable divider and frequency convert the received TV signal into an intermediate-frequency signal having a third frequency, wherein the local oscillator outputs an oscillation signal having a frequency band of at least 847 to 505 MHz, and a dividing rate of the second programmable divider is 1/3, and wherein a dividing rate of the third programmable divider is 1/5.

4. The TV receiving tuner according to claim 1, further comprising:

a third programmable divider to receive the oscillation signal of the local oscillator and divide the oscillation signal; and a fourth mixer to mix the received TV signal and an output of the third programmable divider and frequency convert the received TV signal into an intermediate-frequency signal having a third frequency, wherein the local oscillator outputs an oscillation signal having a frequency band of at least 803 to 473 MHz, and a dividing rate of the second programmable divider is 1/3, and wherein a dividing rate of the third programmable divider is 1/9.

5. The TV receiving tuner of claim 1, further comprising:
a third programmable divider to receive the oscillation signal of the local oscillator and divide the oscillation signal; and
a fourth mixer to mix the received TV signal and an output of the third programmable divider and frequency convert the received TV signal into an intermediate-frequency signal having a third frequency,
wherein the local oscillator outputs an oscillation signal having a frequency band of at least 824 to 530 MHz, and a dividing rate of the second programmable divider is 1/3, and wherein a dividing rate of the third programmable divider is 1/4.

6. The TV receiving tuner according to claim 1, further comprising:
a third programmable divider to receive the oscillation signal of the local oscillator and divide the oscillation signal; and
a fourth mixer to mix the received TV signal and an output of the third programmable divider and frequency convert the received TV signal into an intermediate-frequency signal having a third frequency,
wherein the local oscillator outputs an oscillation signal having a frequency band of at least 767 to 473 MHz, and a dividing rate of the second programmable divider is 1/3, and wherein a dividing rate of the third programmable divider is 1/6.

7. The TV receiving tuner according to claim 1, further comprising:
a first tracking filter to select the TV signal having the first frequency band;
a second tracking filter to select the TV signal having the second frequency band arranged in parallel to the first tracking filter; and
a PLL IC to output a tuning voltage that changes a frequency of the local oscillation signal output from the local oscillator, and
wherein the tuning voltage is applied to the first tracking filter and the second tracking filter to tune a pass band of one of the first tracking filter and the second tracking filter to a frequency of the TV signal to be received.

8. The TV receiving tuner according to claim 7, wherein the first tracking filter and the second tracking filter are a multi-tuning circuit.

9. The TV receiving tuner according to claim 8, further comprising:
a low-noise first preamplifier having an automatic gain control (AGC) function provided after the first tracking filter; and
a low-noise second preamplifier having an AGC function provided after the second tracking filter.

10. The TV receiving tuner according to claim 9, further comprising:
a first image trap circuit to attenuate an image frequency signal corresponding to the TV signal to be received interposed between the first preamplifier and the second mixer; and
a second image trap circuit to attenuate the image frequency signal corresponding to the TV signal to be received interposed between the second preamplifier and the third mixer.

11. The TV receiving tuner according to claim 7, wherein the local oscillator outputs an oscillation signal having a frequency band of at least 847 to 505 MHz, and wherein the dividing rate of the first programmable divider may be set to different values including 1, 1/3 and 1/5.

12. The TV receiving tuner according to claim 7, wherein the local oscillator outputs an oscillation signal having a frequency band of at least 803 to 473 MHz, and wherein the dividing rate of the first programmable divider may be set to different values including 1, 1/3 and 1/9.

13. The TV receiving tuner according to claim 7, wherein the local oscillator outputs an oscillation signal having a frequency band of at least 824 to 530 MHz, and wherein the dividing rate of the first programmable divider may be set to different values including 1, 1/3 and 1/4.

14. The TV receiving tuner according to claim 7, wherein the local oscillator outputs an oscillation signal having a frequency band of at least 767 to 473 MHz, and wherein the dividing rate of the first programmable divider may be set to different values including 1, 1/3 and 1/6.

15. A TV signal receiving tuner for receiving TV signals by dividing the TV signals into a plurality of frequency bands, comprising:
a local oscillator which oscillates at a frequency range corresponding to a received TV signal having a predetermined frequency band;
a first programmable divider which receives a local oscillation signal of the local oscillator and divides the local oscillation signal; and
a first mixer which mixes the received TV signal and an output of the first programmable divider and frequency converts the received TV signal into an intermediate-frequency signal having a predetermined frequency;
a first tracking filter to select the TV signal having the first frequency band;
a second tracking filter to select the TV signal having the second frequency band arranged in parallel to the first tracking filter;
a PLL IC to output a tuning voltage that changes a frequency of the local oscillation signal output from the local oscillator;
a low-noise first preamplifier having an automatic gain control (AGC) function provided after the first tracking filter; and
a low-noise second preamplifier having an AGC function provided after the second tracking filter,
wherein a dividing rate of the first programmable divider is variable and set to 1 to receive a TV signal having a first frequency band and to at most 1/2 to receive a TV signal having a second frequency band, the second frequency band being lower than the first frequency band, the tuning voltage is applied to the first tracking filter and the second tracking filter to tune a pass band of one of the first tracking filter and the second tracking filter to a frequency of the TV signal to be received.

16. The TV receiving tuner according to claim 15, further comprising:
a first image trap circuit to attenuate an image frequency signal corresponding to the TV signal to be received interposed between the first preamplifier and the second mixer; and
a second image trap circuit to attenuate the image frequency signal corresponding to the TV signal to be received interposed between the second preamplifier and the third mixer.

17. The TV receiving tuner according to claim 15, further comprising:
a third programmable divider to receive the oscillation signal of the local oscillator and divide the oscillation signal; and a fourth mixer to mix the received TV signal and an output of the third programmable divider and frequency convert the received TV signal into an intermediate-frequency signal having a third frequency, wherein the local oscillator outputs an oscillation signal having a frequency band of at least 847 to 505 MHz, and a dividing rate of the second programmable divider is 1/3, and wherein a dividing rate of the third programmable divider is 1/5.

18. The TV receiving tuner according to claim 15, further comprising:

a third programmable divider to receive the oscillation signal of the local oscillator and divide the oscillation signal; and a fourth mixer to mix the received TV signal and the output of the third programmable divider and frequency convert the received TV signal into an intermediate-frequency signal having a third frequency, wherein the local oscillator outputs an oscillation signal having a frequency band of at least 803 to 473 MHz, wherein a dividing rate of the second programmable divider is 1/3, and a dividing rate of the third programmable divider is 1/9.

19. The TV receiving tuner according to claim 15, further comprising:

a third programmable divider to receive the oscillation signal of the local oscillator and divide the oscillation signal; and a fourth mixer to mix the received TV signal and the output of the third programmable divider and frequency convert the received TV signal into an intermediate-frequency signal having a third frequency, wherein the local oscillator outputs an oscillation signal having a frequency band of at least 824 to 530 MHz, wherein a dividing rate of the second programmable divider is 1/3, and a dividing rate of the third programmable divider is 1/4.

20. The TV receiving tuner according to claim 15, further comprising:

a third programmable divider to receive the oscillation signal of the local oscillator and divide the oscillation signal; and a fourth mixer to mix the received TV signal and the output of the third programmable divider and frequency convert the received TV signal into an intermediate-frequency signal having a third frequency, wherein the local oscillator outputs an oscillation signal having a frequency band of at least 767 to 473 MHz, wherein a dividing rate of the second programmable divider is 1/3, and a dividing rate of the third programmable divider is 1/6.

* * * * *